US012568789B2

(12) United States Patent
Ogura et al.

(10) Patent No.: US 12,568,789 B2
(45) Date of Patent: Mar. 3, 2026

(54) EQUIPMENT FRONT END MODULE

(71) Applicant: SINFONIA TECHNOLOGY CO., LTD., Tokyo (JP)

(72) Inventors: Gengoro Ogura, Tokyo (JP); Toshihiro Kawai, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 309 days.

(21) Appl. No.: 18/387,524

(22) Filed: Nov. 7, 2023

(65) Prior Publication Data

US 2024/0153797 A1     May 9, 2024

(30) Foreign Application Priority Data

Nov. 8, 2022    (JP) ................................. 2022-178617

(51) Int. Cl.
H01L 21/67         (2006.01)
(52) U.S. Cl.
CPC .............................. H01L 21/67196 (2013.01)
(58) Field of Classification Search
CPC .......................... H01L 21/67196; H01L 21/67
See application file for complete search history.

(56) References Cited

U.S. PATENT DOCUMENTS

| | | | |
|---|---|---|---|
| 10,159,169 B2 | 12/2018 | Vincent et al. | |
| 11,302,552 B1 * | 4/2022 | Huang | H01L 21/67772 |
| 2018/0124960 A1 * | 5/2018 | Vincent | H01L 21/67201 |

FOREIGN PATENT DOCUMENTS

JP          6882467 B2     6/2021

* cited by examiner

*Primary Examiner* — Ronald P Jarrett
(74) *Attorney, Agent, or Firm* — Kilpatrick Townsend & Stockton LLP

(57) ABSTRACT
An EFEM includes a housing including a transfer chamber in which a processing target object is transferred, and a connection module provided between the transfer chamber and a front chamber, wherein the housing includes a rear member having a housing-side opening through which the processing target object is capable of passing, the connection module includes a first frame part arranged around the housing-side opening and pressed by a transfer chamber-side surface of the rear member, a second frame part provided in the front chamber and arranged around a front chamber-side opening, and connected to the first frame part, and a sealing part configured to seal the second frame part and the front chamber, and the sealing part includes a flexible portion capable of expanding and contracting at least in a predetermined direction, and an enclosure portion connected to the flexible portion and configured to enclose the front chamber-side opening.

11 Claims, 13 Drawing Sheets

116 — Supply source

114

2

32

45

44   45   V   44   45

42

44 { 44a
    44b

47

37

IV 21    22    23

IV

41

3 { 3b
   3a

24

31

V

Up

Left ←→ Right

Down

EQUIPMENT FRONT END MODULE

CROSS-REFERENCE TO RELATED APPLICATION

This application is based upon and claims the benefit of priority from Japanese Patent Application No. 2022-178617, filed on Nov. 8, 2022, the entire contents of which are incorporated herein by reference.

TECHNICAL FIELD

The present disclosure relates to an EFEM.

BACKGROUND

Patent Document 1 discloses an interface (hereinafter, referred to as a connection module) for connecting an equipment front end module (EFEM) and a load lock assembly (hereinafter, referred to as a front chamber) provided in an electronic device processing system. More specifically, the EFEM and the front chamber are arranged side by side in a predetermined direction. Further, the connection module includes a plate-shaped installation member and a bellows-shaped flexible sealing member. The installation member is connected to the front chamber. The flexible sealing member is connected to and disposed around the installation member. The flexible sealing member includes a sealing flange configured to seal a periphery of an opening portion within the EFEM. More specifically, the installation member is fixed to the front chamber by a fixture from an EFEM side in a predetermined direction. The sealing flange is fixed to a wall of the EFEM by a fixture from a front chamber side in a predetermined direction.

In the connection module described above, the flexible sealing member allows the positional relationship between the installation member and the sealing flange to be easily changed in a predetermined direction. Therefore, even if a positional deviation between the EFEM and the front chamber in a predetermined direction is large due to a design error, the positional deviation is allowed to some extent.

PRIOR ART DOCUMENT

Patent Document

Patent Document 1: Japanese Patent No. 6882467

In order to actually install the above-described connection module to the EFEM and the front chamber, it is necessary to access the connection module from the both inside and outside the EFEM. However, if a front chamber is already provided, a situation in which a sufficient operation space is not provided outside the EFEM may occur. In such a case, a problem occurs in that the connection module cannot be installed to the EFEM.

SUMMARY

The present disclosure provides an EFEM that makes it possible to easily install a connection module on the EFEM and a front chamber even when it is not possible to perform an operation of installing the connection module outside the EFEM.

An EFEM of a first aspect includes comprising a housing including a transfer chamber in which a processing target object is transferred, and a connection module provided between the transfer chamber and a front chamber, which is provided in a processing apparatus for performing a predetermined process on the processing target object, wherein the housing includes a rear member having a housing-side opening through which the processing target object is capable of passing, wherein the connection module includes a first frame part arranged around the housing-side opening and pressed by a transfer chamber-side surface of the rear member when the housing-side opening is viewed from the transfer chamber side, a second frame part provided in the front chamber and arranged around a front chamber-side opening through which the processing target object is capable of passing when the housing-side opening is viewed from the transfer chamber side, and connected to the first frame part, and a sealing part arranged closer to the front chamber than the second frame part, fixed to the second frame part, and configured to seal the second frame part and the front chamber by being pressed by a front chamber-side opening portion which forms the front chamber-side opening, and wherein the sealing part includes a flexible portion capable of expanding and contracting at least in a predetermined direction in which the housing and the processing apparatus are arranged side by side and an enclosure portion connected to the flexible portion and configured to enclose the front chamber-side opening.

In the present disclosure, the first frame part can be pressed by the rear member from the transfer chamber side. Further, the enclosure portion of the sealing part can be pressed by the front chamber-side opening portion from the transfer chamber side. Thus, after both the EFEM and the processing apparatus are installed, the connection module can be pressed by the rear member and the front chamber-side opening portion from the transfer chamber side (i.e., inside the housing). In addition, by moving the enclosure portion in the predetermined direction to adjust the position thereof after pressing the first frame part against the rear member, it is possible to easily compensate for the positional deviation between the enclosure portion and the front chamber-side opening portion in the predetermined direction. Therefore, even if the connection module cannot be installed outside the EFEM, the connection module can be easily installed on (pressed by) the EFEM and the front chamber.

In an EFEM of a second aspect according to the first aspect, the front chamber-side opening portion includes a first installation member on which the enclosure portion is installed and a second installation member arranged closer to the front chamber than the first installation member so that the first installation member is fixed to the second installation member, wherein the first installation member is part of the connection module and the second installation member is part of the front chamber.

In the present disclosure, the connection module can be installed on any front chamber by preparing the first installation member according to the specifications of the second installation member belonging to the front chamber.

In an EFEM of a third aspect according to the first or second aspect, the flexible portion has a bellows structure for expanding and contracting the sealing part in a predetermined direction.

In order to sufficiently maintain airtightness of a space between the transfer chamber and the front chamber, it is necessary to use a member with relatively high strength as the flexible portion. For this reason, in a configuration in which the flexible portion is maintained in an extended (or contracted) state only when an external force is applied to the flexible portion, it may be necessary to apply a considerable force to the flexible portion when aligning the enclosure portion and the front chamber-side opening portion. In such a case, when installing the connection module on the EFEM and the processing apparatus, it is necessary to continue applying the force to the flexible portion, which may make the installation operation difficult. In this regard, since the flexible portion has a bellows structure in the present disclosure, once the flexible portion is deformed, the shape after deformation is maintained to some extent even if no force is applied again. Therefore, the installation operation can be easily performed.

In an EFEM of a fourth aspect according to the first or second aspect, the second frame part is arranged closer to the front chamber than the first frame part, the connection module includes a hollow protrusion, which is arranged between the first frame part and the second frame part and protrudes toward the front chamber side beyond the rear member, and the protrusion includes an opening capable of connecting a space outside the housing and a space inside the protrusion, and a cover capable of opening and closing the opening.

Generally, when the EFEM is completed, it is not easy to check the state in which the processing target object is being transferred between the EFEM and the front chamber. Furthermore, it is not easy to enter the transfer chamber and perform inspection and/or maintenance of the connection module. In this regard, in the present disclosure, by removing the cover from the protrusion and opening the opening, it is possible to visually check a state in which the processing target object is being transferred from the outside of the housing. Furthermore, by removing the cover from the protrusion and opening the opening while the operation of the EFEM is stopped, it is possible to perform inspection and/or maintenance of the connection module and its surroundings.

In an EFEM of a fifth aspect according to the first or second aspect, the second frame part is arranged closer to the front chamber than the first frame part, the connection module includes a hollow protrusion, which is arranged between the first frame part and the second frame part and protrudes toward the front chamber side beyond the rear member, and the protrusion includes an opening capable of connecting a space outside the housing and a space inside the protrusion, and a cover capable of opening and closing the opening.

In the present disclosure, it is possible to further improve the airtightness of the space connecting the transfer chamber and the front chamber while maintaining an environment in which the installation operation is easy to perform.

BRIEF DESCRIPTION OF DRAWINGS

The accompanying drawings, which are incorporated in and constitute a part of the specification, illustrate embodiments of the present disclosure.

FIG. 2 is a diagram showing an electrical configuration of an EFEM.

FIG. 12 is an explanatory diagram showing a method of installing the connection module on the EFEM and the load lock chamber.

FIG. 13 is a schematic diagram of a cross section of a connection module according to a modification, which is orthogonal to an up-down direction.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
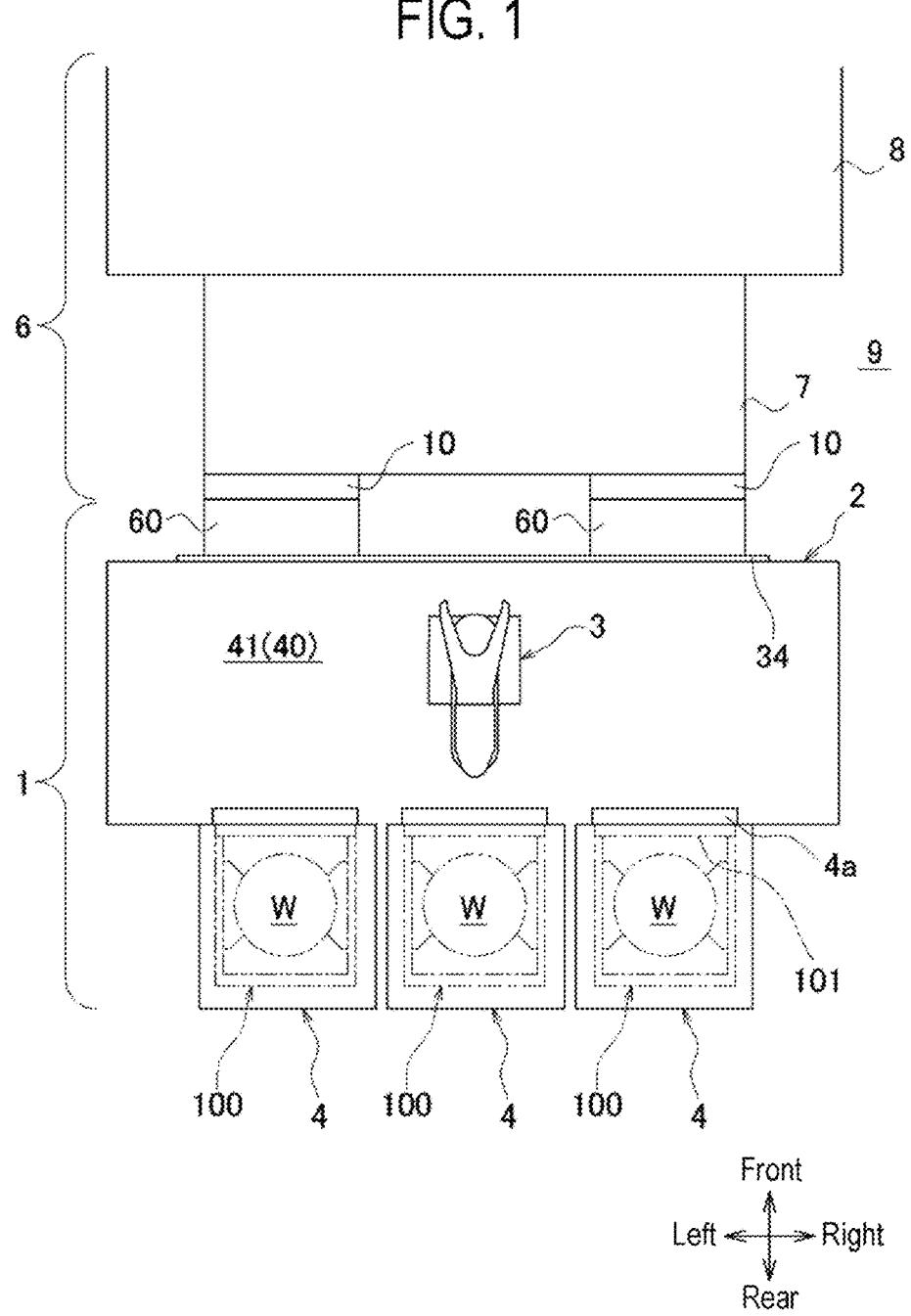
FIG. 1 is a schematic plan view of an EFEM according to the present embodiment and surroundings thereof.

Next, embodiments of the present disclosure will be described. For the sake of convenience of description, directions shown in FIG. 1 are defined as front, rear, left, and right directions. That is, a direction in which an EFEM (Equipment Front End Module) 1 and a processing apparatus 6 are arranged side by side is defined as a front-rear direction (a predetermined direction in the present disclosure). In the front-rear direction, an EFEM 1 side is defined as a front side (a transfer chamber side in the present disclosure). The front side corresponds to a second side in the predetermined direction. In the front-rear direction, the processing apparatus 6 side is defined as a rear side (a front chamber side in the present disclosure). The rear side corresponds to a first side in the predetermined direction. A direction in which a plurality of load ports 4 are arranged side by side and which is orthogonal to the front-rear direction, is defined as a left-right direction. In addition, a direction orthogonal to both the front-back direction and the left-right direction is defined as an up-down direction.

(Schematic Configuration of EFEM and Surroundings)

Figure 2:
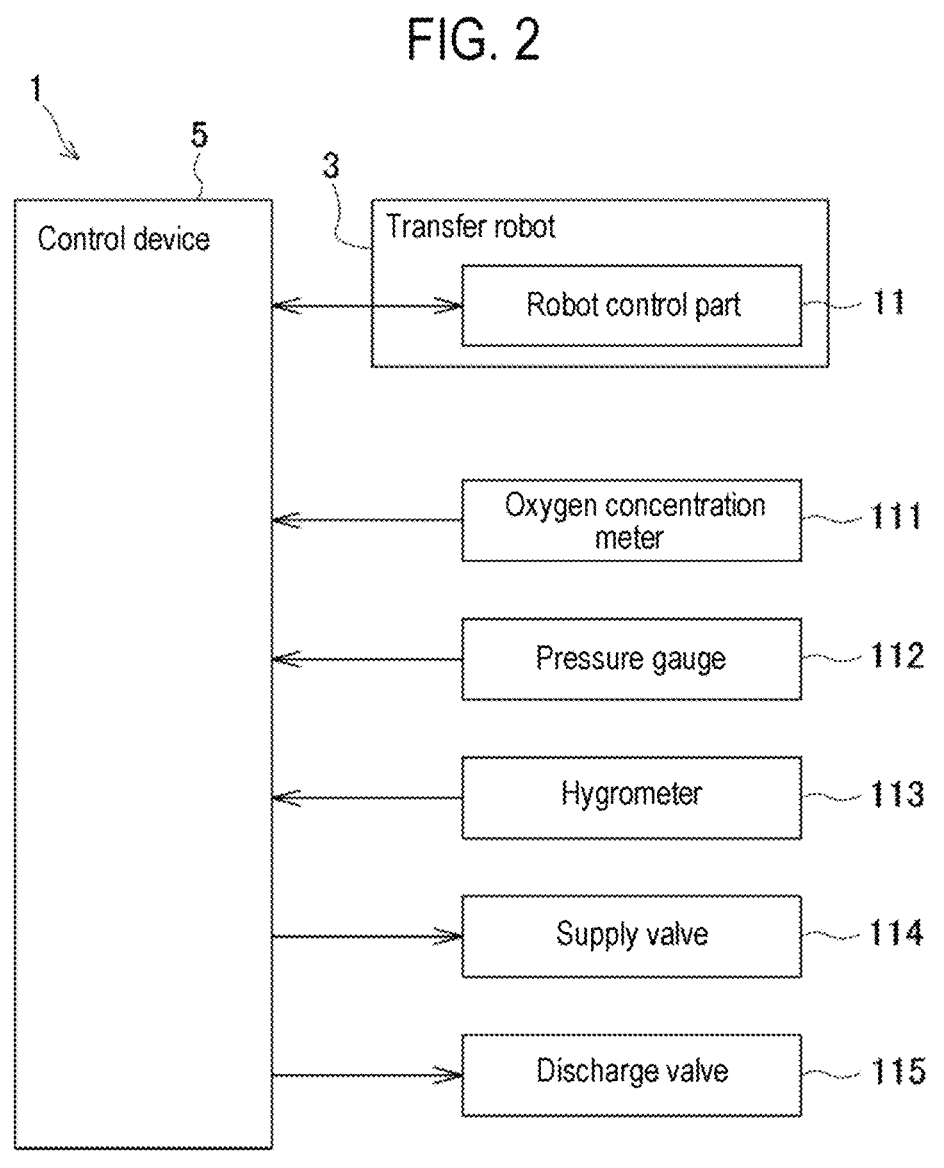

The schematic configuration of an EFEM 1 and surroundings of will be described with reference to FIGS. 1 and 2. FIG. 1 is a schematic plan view of an EFEM 1 according to the present embodiment and surroundings thereof. FIG. 2 is a diagram showing the electrical configuration of the EFEM 1. The EFEM 1 includes a housing 2, a transfer robot 3, a plurality of load ports 4, and a control device 5 (see FIG. 2). A processing apparatus 6 is arranged on a rear side of the EFEM 1. The processing apparatus 6 is an apparatus which performs a predetermined process on a wafer W (processing target object in the present disclosure) which is a semiconductor substrate. The predetermined process may be, for example, a process (sputtering, dry etching, etc.) performed in a vacuum chamber, or may be another process. The EFEM 1 transfers the wafer W between a FOUP (Front-Opening Unified Pod) 100 placed on the load port 4 and the processing apparatus 6 by using a transfer robot 3 disposed in the housing 2. The FOUP 100 is a container that is capable of accommodating a plurality of wafers W arranged in the up-down direction. A lid 101 is installed on a rear end portion of the FOUP 100 (an end on the housing 2 side in the front-rear direction). The FOUP 100 is transferred by a transfer device (not shown). The FOUP 100 is transferred between the transfer device and the load port 4.

The housing 2 is used for connecting the plurality of load ports 4 and the processing apparatus 6. As shown in FIG. 1, a transfer chamber 41 in which the wafer W is transferred is formed inside the housing 2. The transfer chamber 41 is substantially sealed from a space outside the housing 2 (hereinafter referred to as an external space 9). When the EFEM 1 is in operation, the transfer chamber 41 is filled with an inert gas (e.g., nitrogen). The housing 2 is configured such that an inert gas circulates through an internal space 40 including the transfer chamber 41. The transfer chamber 41 is connected to a load lock chamber 7 (the front chamber in the present disclosure) of the processing apparatus 6 via a known gate valve 10 and a connection module 60, which will be described later. The gate valve 10 is disposed, for example, on a rear side of the rear end portion of the housing 2 (the vicinity of the rear wall 34 described later). The gate valve 10 is part of the load lock chamber 7. In the present embodiment, two gate valves 10 are arranged in the left-right direction. The wafer W is transferred between the transfer chamber 41 and the load lock chamber 7 through one of the gate valves 10. The number of gate valves 10 is not limited thereto.

The transfer robot 3 is configured to transfer the wafer W within the transfer chamber 41. The transfer robot 3 includes, for example, a base part 3a (see FIG. 3), an arm mechanism 3b (see FIG. 3), and a robot control part 11 (see FIG. 2). The base part 3a is a part whose position is fixed in the transfer chamber 41. The arm mechanism 3b is installed on the base part 3a and is configured to hold and transfer the wafer W. The transfer robot 3 mainly performs an operation of taking out the wafer W from the FOUP 100 and delivering it to the processing apparatus 6, and an operation of receiving the wafer W processed by the processing apparatus 6 and returning it to the FOUP 100.

Figure 5:
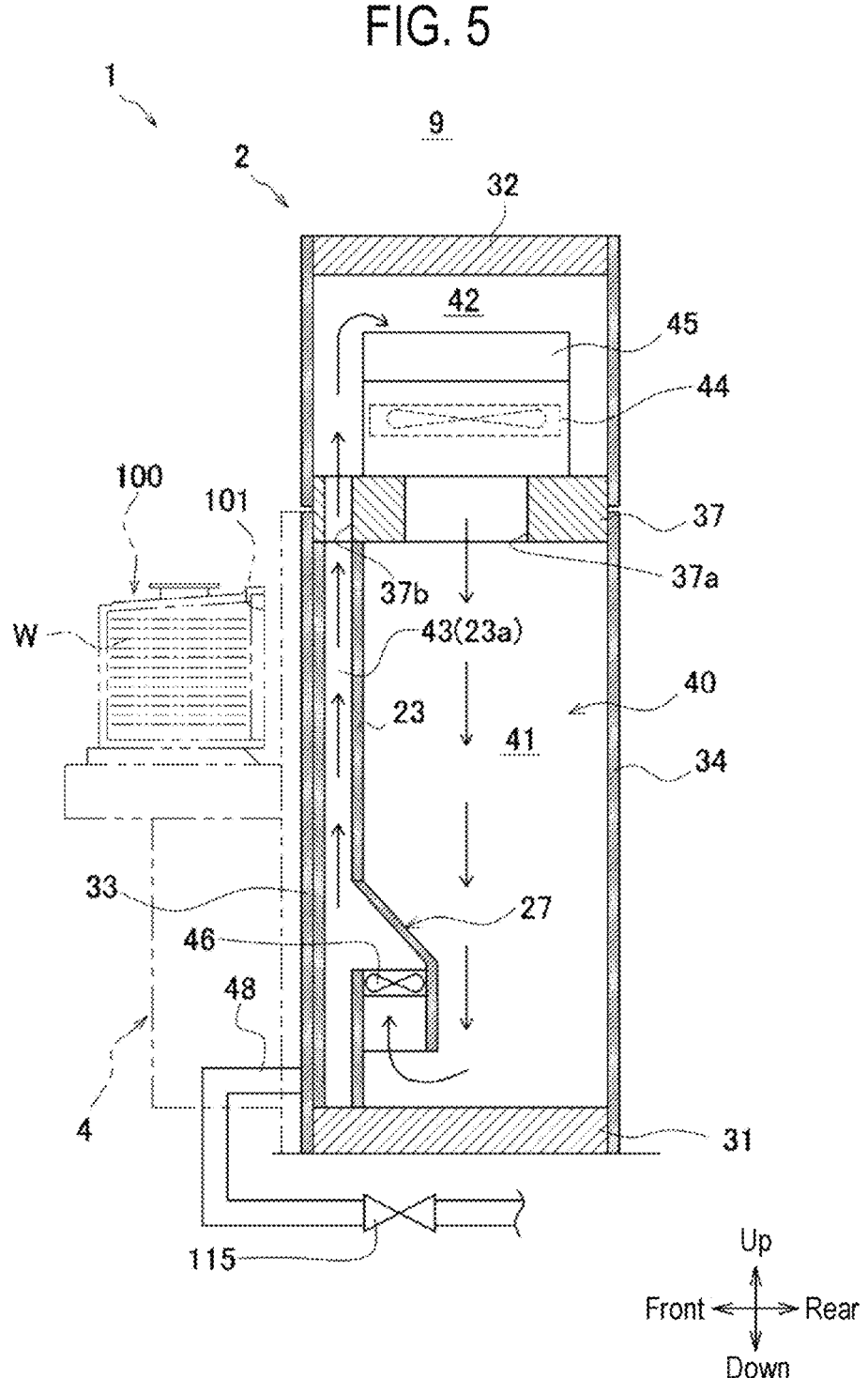
FIG. 5 is a cross-sectional view taken along line V-V in FIG. 3.

Each of the plurality of load ports 4 is configured such that the FOUP 100 can be placed thereon (see FIG. 5). The plurality of load ports 4 are arranged side by side in the left-right direction. The rear end portion of each load port 4 is arranged along the front partition wall of the housing 2. The load port 4 is configured to be capable of replacing an atmosphere in the FOUP 100 with an inert gas (e.g., nitrogen). A door 4a is provided at the rear end portion of the load port 4. The door 4a is opened and closed by a door opening/closing mechanism (not shown). The door 4a is configured to be capable of unlocking the lid 101 of the FOUP 100 and holding the lid 101. As the door moving mechanism opens the door 4a in a state in which the unlocked lid 101 is held by the door 4a, the lid 101 is opened. This enables the wafer W in the FOUP 100 to be taken out by the transfer robot 3.

As shown in FIG. 2, the control device 5 is electrically connected to the robot control part 11 of the transfer robot 3, the control part (not shown) of the load port 4, and the control part (not shown) of the processing apparatus 6 to perform communication with these control parts. The control device 5 is electrically connected to measurement instruments such as an oxygen concentration meter 111, a pressure gauge 112, a hygrometer 113, and the like installed in the housing 2. The control device 5 receives the measurement results of these measurement instruments and recognizes information regarding an atmosphere inside the housing 2. The control device 5 is electrically connected to the supply valve 114 and the discharge valve 115. The control device 5 appropriately adjusts the atmosphere inside the housing 2 by adjusting the opening degrees of these valves.

The processing apparatus 6 (see FIG. 1) includes, for example, a load lock chamber 7 and a processing chamber 8. The load lock chamber 7 is a chamber for temporarily keeping the wafer W on standby. A pressure inside the load lock chamber 7 is maintained at, for example, a pressure close to vacuum (a pressure much lower than a pressure in the transfer chamber 41). The load lock chamber 7 is connected to the transfer chamber 41 via, for example, a gate valve 10. The processing chamber 8 is connected to the load lock chamber 7 via, for example, a door (not shown). In the processing chamber 8, a predetermined process is performed on the wafer W by a processing mechanism (not shown). (Housing and its Internal Configuration)

Figure 3:
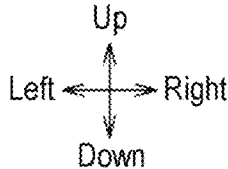
FIG. 3 is a front view of a housing.
Figure 4:
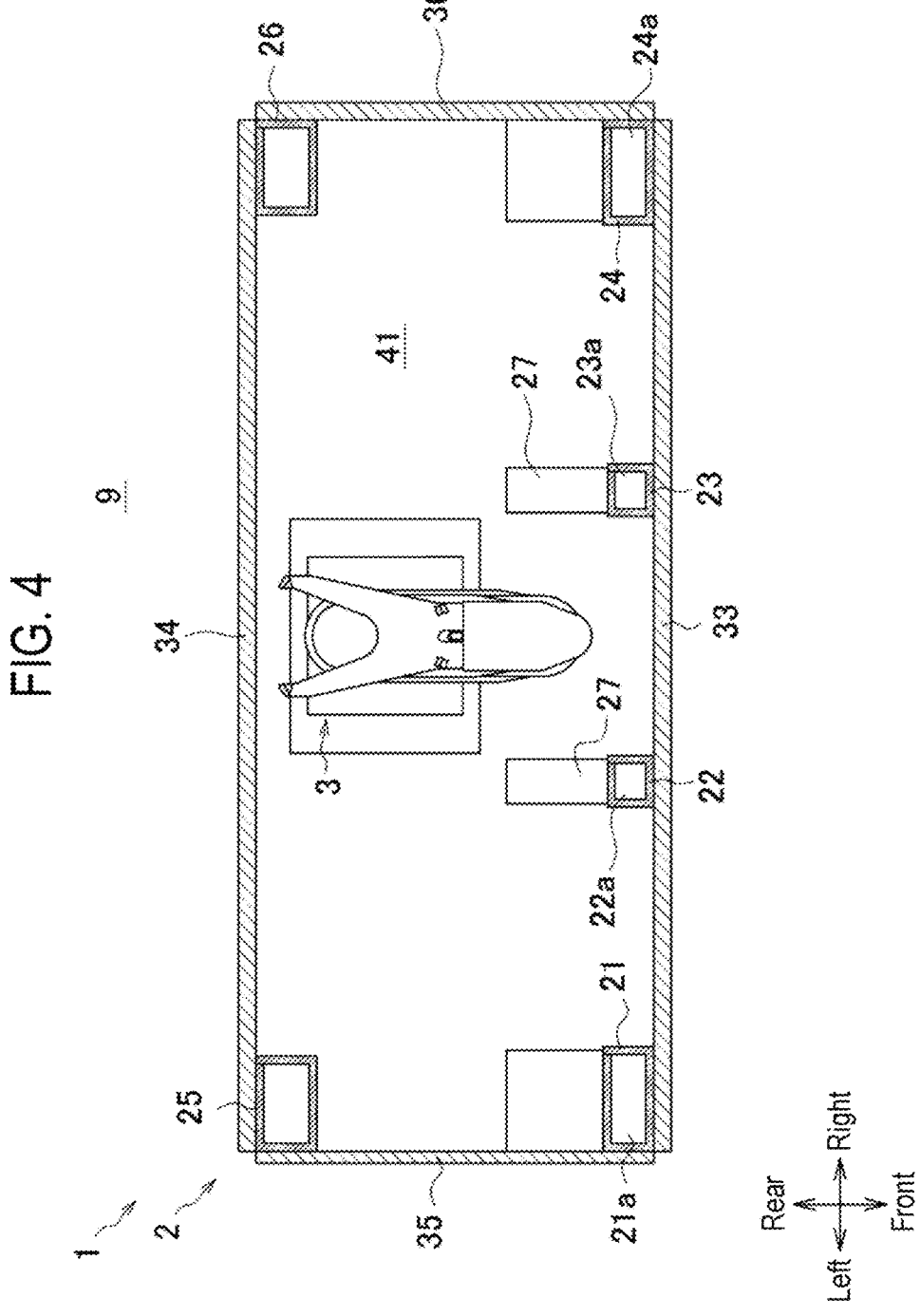
FIG. 4 is a cross-sectional view taken along line IV-IV in FIG. 3.

Next, the housing 2 and its internal configuration will be described with reference to FIGS. 3 to 5. FIG. 3 is a front view of the housing 2. FIG. 4 is a cross-sectional view taken along line IV-IV in FIG. 3. FIG. 5 is a cross-sectional view taken along line V-V in FIG. 3. In FIG. 3, the illustration of partition walls, which will be described later, is omitted. In FIG. 5, the illustration of the transfer robot 3 and the like is omitted.

The housing 2 has a rectangular parallelepiped shape as a whole. As shown in FIGS. 3 to 5, the housing 2 includes columns 21 to 26 and a plurality of partition walls (a bottom plate 31, a top plate 32, a front wall 33, a rear wall 34, a left wall 35, and a right wall 36). The plurality of partition walls are installed on the columns 21 to 26 extending in the up-down direction, and the internal space 40 of the housing 2 is substantially sealed from the external space 9.

More specifically, as shown in FIG. 4, the columns 21 to 24 are arranged side by side in the named order from the left end of the front end portion of the housing 2 to the right end of the front end portion of the housing 2. The columns 22 and 23 are shorter than the columns 21 and 24, for example. The column 25 is arranged at the left end of the rear end portion of the housing 2. The column 26 is arranged at the right end of the rear end portion of the housing 2.

The bottom plate 31 is arranged at the bottom of the housing 2 (see FIG. 3). The top plate 32 is arranged at a ceiling of the housing 2 (see FIG. 3). The front wall 33 is arranged at the front end portion of the housing 2 (see FIG. 4). The rear wall 34 (the rear member in the present disclosure) is arranged at the rear end portion of the housing 2 (see FIG. 4). The left wall 35 is arranged at the left end portion of the housing 2 (see FIG. 4). The right wall 36 is arranged at the right end portion of the housing 2 (see FIG. 4). These members are formed of, for example, a general sheet metal (a rolled metal plate with a thickness of 6 mm or less).

As shown in FIGS. 3 and 5, a support plate 37 extending in the horizontal direction is arranged in an upper portion of the housing 2 (above the columns 22 and 23). As a result, the inside of the housing 2 is divided into the aforementioned transfer chamber 41 formed on the lower side and an FFU installation chamber 42 formed on the upper side. In the FFU installation chamber 42, an FFU (fan filter unit) 44, which will be described later, is arranged. An opening 37a for connecting the transfer chamber 41 and the FFU installation chamber 42 is formed at a central portion of the support plate 37 in the front-rear direction.

Next, a configuration for circulating an inert gas within the housing 2 will be described with reference to FIGS. 3 to 5. As shown in FIG. 5, a circulation path for circulating an inert gas is formed in the internal space 40 of the housing 2. The circulation path includes a transfer chamber 41, an FFU installation chamber 42, and a return path 43. In the internal space 40, the inert gas purified by the FFU 44 is sent downward from the FFU installation chamber 42. After reaching the lower end portion of the transfer chamber 41, the inert gas rises through the return path 43 and returns to the FFU installation chamber 42 (see arrows in FIG. 5).

The FFU installation chamber 42 is arranged above the transfer chamber 41. The FFU installation chamber 42 is provided with an FFU 44 and a chemical filter 45. The FFU 44 is arranged on the support plate 37. The FFU 44 is configured to send the inert gas in the FFU installation chamber 42 downward and remove particles (not shown) contained in the inert gas. The chemical filter 45 is configured to remove, for example, an active gas and the like brought into the internal space 40 from the processing apparatus 6. The inert gas purified by the FFU 44 and the chemical filter 45 is sent from the FFU installation chamber 42 to the transfer chamber 41 through an opening 37a formed in the support plate 37. The inert gas sent to the transfer chamber 41 forms a laminar flow and flows downward.

The return path 43 is formed in the columns 21 to 24 (the column 23 in FIG. 5) arranged at the front end portion of the housing 2 and the support plate 37. That is, the columns 21 to 24 are, for example, hollow, and spaces 21a to 24a, through which the inert gas passes (see FIG. 4), are formed in the columns 21 to 24, respectively. Each of the spaces 21a to 24a constitutes the return path 43. The return path 43 is connected to the FFU installation chamber 42 through an opening 37b formed at the front end portion of the support plate 37 (see FIG. 5).

The return path 43 will be described with reference to FIG. 5. Although the column 23 is shown in FIG. 5, the same applies to the other columns 21, 22 and 24. An introduction duct 27 is installed on the lower end portion of the column 23 to guide the inert gas in the transfer chamber 41 toward the return path 43 (space 23a). The inert gas which has reached the lower end portion of the transfer chamber 41 flows into the introduction duct 27 through the inlet of the introduction duct 27. A fan 46 is arranged inside the introduction duct 27. The fan 46 is rotationally driven by a motor (not shown). The fan 46 sucks the inert gas which has reached the lower end portion of the transfer chamber 41 and sends it upward (toward the return path 43). Thus, the inert gas returns to the FFU installation chamber 42 through the return path 43. The inert gas returned to the FFU installation chamber 42 is purified by the FFU 44 and the chemical filter 45, and is sent out to the transfer chamber 41 again. In this way, the inert gas circulates through the circulation path.

As shown in FIG. 3, for example, a supply pipe 47 for supplying an inert gas to the internal space 40 is connected to a side portion of the FFU installation chamber 42. The supply pipe 47 is connected to a supply source 116 of the inert gas (e.g., nitrogen). A supply valve 114 capable of changing an amount of the inert gas supplied per unit time is provided in an intermediate portion of the supply pipe 47.

As shown in FIG. 5, a discharge pipe 48 for discharging a gas in the circulation path is connected to the front end portion of the transfer chamber 41. The discharge pipe 48 is connected to, for example, an exhaust port (not shown). A discharge valve 115 capable of changing an amount of the gas in the circulation path discharged per unit time is provided in an intermediate portion of the discharge pipe 48. The supply valve 114 and the discharge valve 115 are electrically connected to the control device 5 (see FIG. 2). This makes it possible to supply the inert gas to the internal space 40 and to discharge the gas from the internal space 40.

In the EFEM 1, in order to suppress deterioration in the quality of the wafer W, the oxygen concentration within the internal space 40 needs to be maintained at a predetermined target concentration or less. Furthermore, in the EFEM 1, in order to similarly suppress deterioration in the quality of the wafer W, the humidity in the internal space 40 needs to be maintained at a predetermined target value or less. The control device 5 adjusts an opening degree of the supply valve 114 based on a detection result obtained by the oxygen concentration meter 111 and/or a detection result obtained by the hygrometer 113. Thus, a flow rate of the inert gas supplied to the internal space 40 is adjusted. As a result, the oxygen concentration in the interior space 40 and the humidity in the interior space 40 are adjusted. Further, in the EFEM 1, the pressure in the internal space 40 needs to be maintained slightly higher than the pressure in the external space 9. This is to suppress leakage of the inert gas from the internal space 40 to the external space 9 and to prevent an ambient air from entering the internal space 40 from the external space 9. The control device 5 adjusts an opening degree of the discharge valve 115 based on the detection result obtained by the pressure gauge 112. Thus, an exhaust flow rate of the inert gas from the internal space 40 is adjusted. As a result, the pressure in the interior space 40 is regulated. As described above, the atmosphere in the internal space 40 is controlled by adjusting the supply flow rate and the discharge flow rate of the inert gas.

(Front End Portion of Load Lock Chamber)

Figures 6A, 6B:
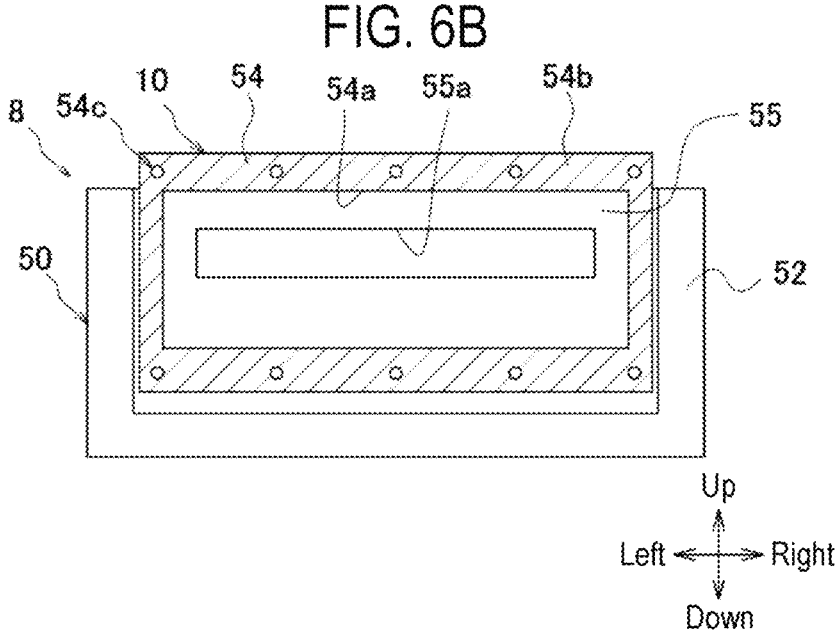
FIGS. 6A and 6B are views showing a front end portion of a load lock chamber.

Next, members constituting the front end portion of the load lock chamber 7 will be described with reference to FIGS. 6A and 6B. FIG. 6A is a plan view of the front end portion of the load lock chamber 7. FIG. 6B is a front view of the front end portion of the load lock chamber 7. More specifically, each of FIGS. 6A and 6B is a view showing the gate valve 10 and its surrounding configuration.

The front end portion of the load lock chamber 7 is formed by, for example, a frame member 50. The frame member 50 is formed by cutting, for example, a block made of a metal material. As shown in FIG. 6A, the frame member 50 includes, for example, a wall portion 51, a wall portion 52, and a partition portion 53. The wall portion 51 is a portion which forms the load lock chamber 7. The wall portion 52 is a portion which forms a connection space SC. The connection space SC is a space in which the gate valve 10 and a connection module 60, which will be described later, are arranged. The connection space SC is arranged between the load lock chamber 7 and the transfer chamber 41 of the housing 2. More specifically, in the present embodiment, the connection space SC is arranged between the partition portion 53 and the rear wall 34 in the front-rear direction. The partition portion 53 is, for example, a portion which extends in the left-right direction and partitions the load lock chamber 7 and the connection space SC. The partition portion 53 is formed with an opening 53a (see FIG. 6A) which extends in the left-right direction, for example. The opening 53a has a size which allows a leading end portion of the arm mechanism 3b (i.e., a portion which holds the wafer W) and the wafer W to pass through the opening 53a in the front-rear direction.

The gate valve 10 is configured to be capable of opening and closing the opening 53a. The gate valve 10 includes a frame portion 54 (a second installation member in the present disclosure) (see FIGS. 6A and 6B) and a gate portion 55 (see FIG. 6B). The frame portion 54 is, for example, a substantially rectangular parallelepiped-shaped member. The frame portion 54 includes an opening 54*a* opened on the front side. The frame portion 54 is arranged so as to surround a through hole 55*a* (see FIG. 6B) of the gate portion 55 when viewed from the front side. An installation surface 54*b* (see the hatched portion in FIG. 6B) for installing the connection module 60 is formed at the front end of the frame portion 54. A plurality of thread holes 54*c* (see FIG. 6B) are formed in the installation surface 54*b*. The gate portion 55 includes a through hole 55*a* extending in the front-rear direction. The through hole 55*a* has a size which allows the leading end portion of the arm mechanism 3*b* and the wafer W to pass through the through hole 55*a* in the front-rear direction. The through hole 55*a* is opened and closed by an opening/closing mechanism (not shown).

(Connection Module)

Furthermore, the EFEM 1 includes a connection module 60 (see FIGS. 7A to 9). The connection module 60 is configured to connect the transfer chamber 41 and the load lock chamber 7 while ensuring sealability of the transfer chamber 41 and the load lock chamber 7. The connection module 60 is arranged in the connection space SC. The connection module 60 is configured as follows so that it can be easily installed on the EFEM 1 and the load lock chamber 7.

Figure 7A:
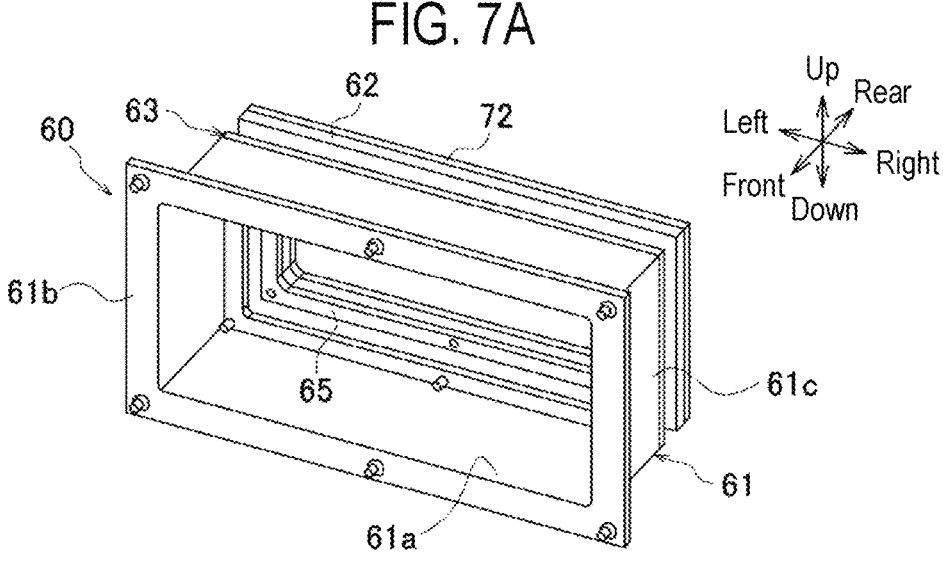
FIGS. 7A and 7B are perspective views of a connection module.
Figure 7B:
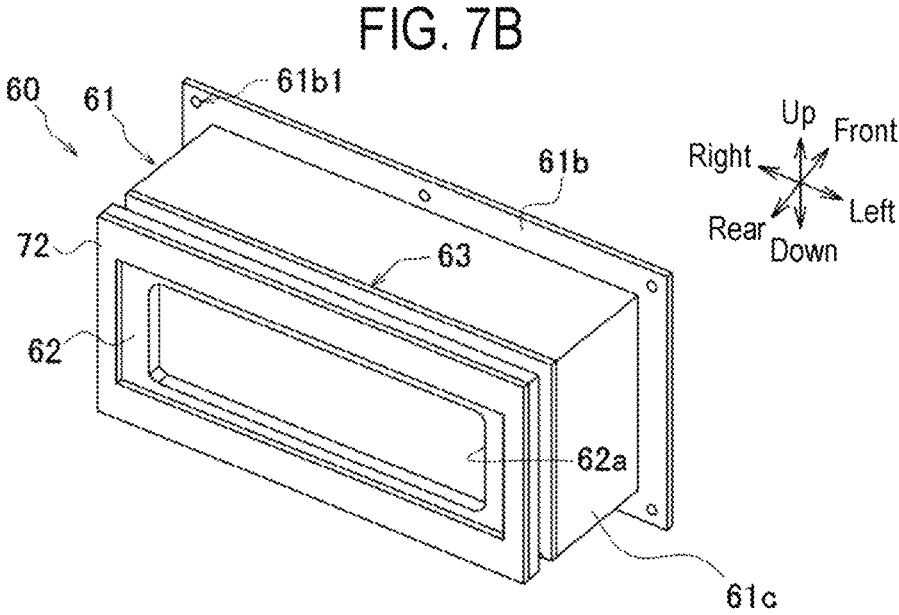
Figure 8:
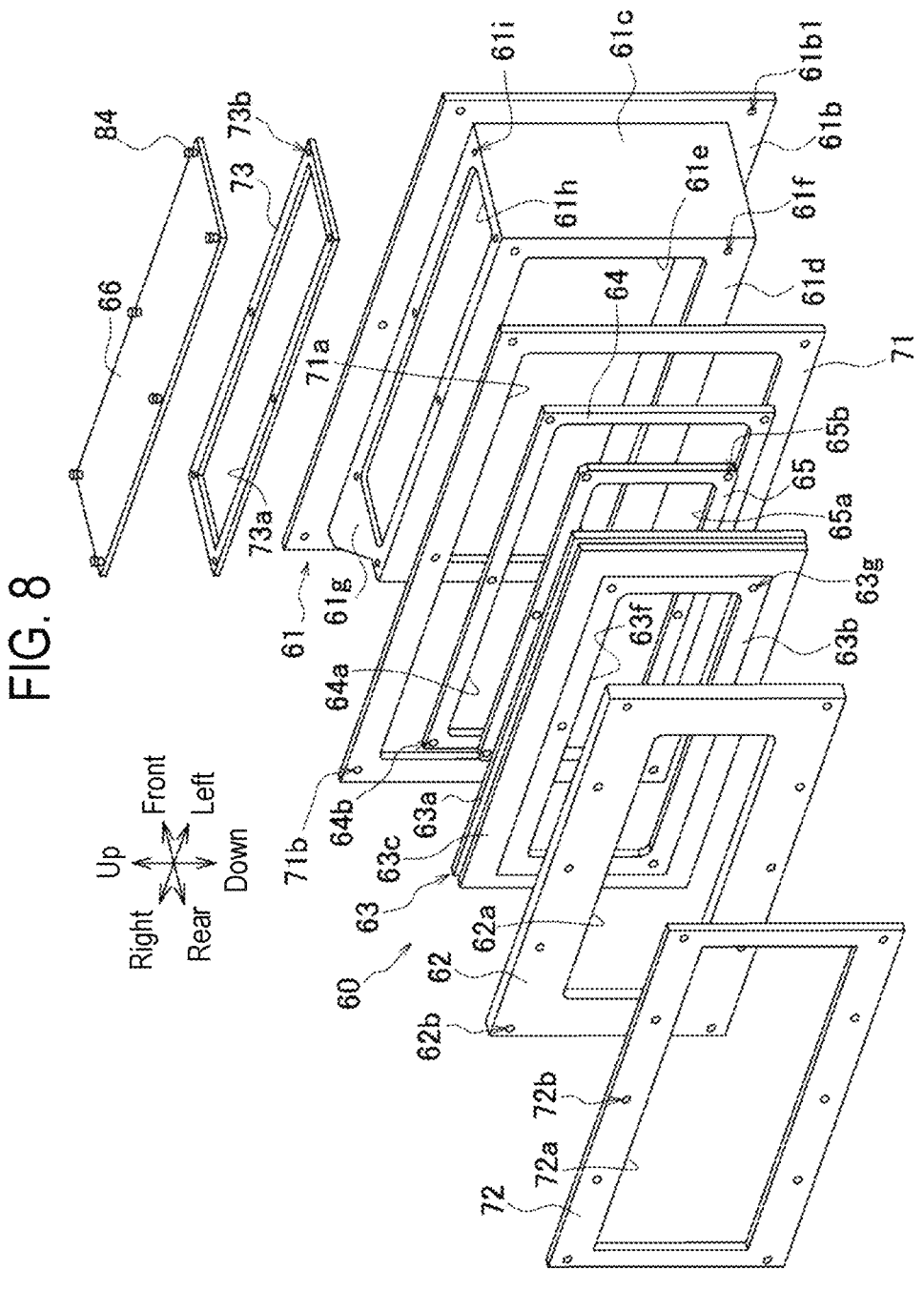
FIG. 8 is an exploded perspective view of a connection module.
Figure 9:
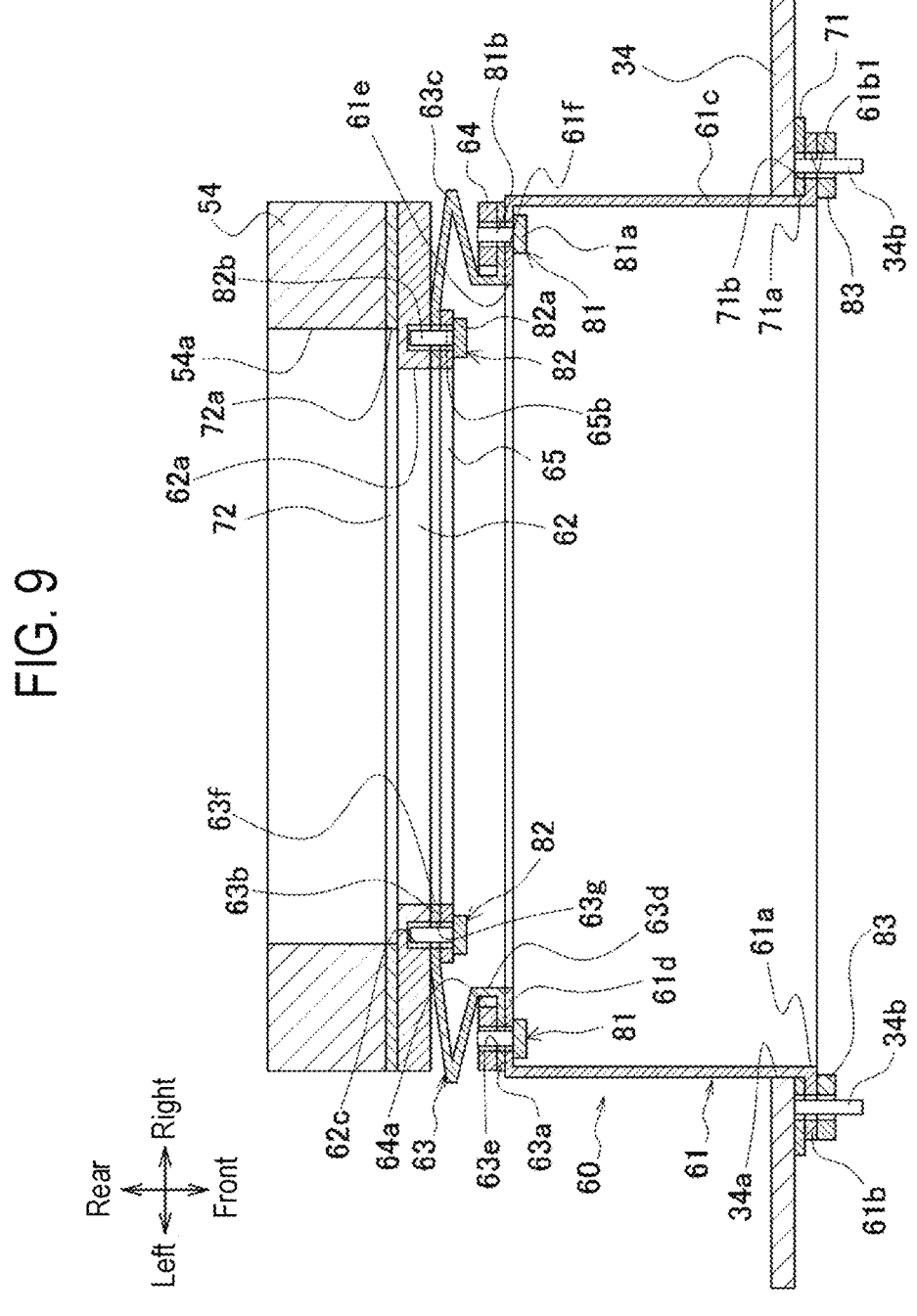
FIG. 9 is a schematic diagram of a cross section of a connection module orthogonal to an up-down direction.

The configuration of the connection module 60 will be described with reference to FIGS. 7A to 9. FIG. 7A is a perspective view of the connection module 60 viewed obliquely from the front side. FIG. 7B is a perspective view of the connection module 60 viewed obliquely from the rear side. FIG. 8 is an exploded perspective view of the connection module 60. FIG. 9 is a schematic diagram of a cross section of the connection module 60 orthogonal to the up-down direction.

As shown in FIGS. 7A to 9, the connection module 60 includes, for example, a main body 61, a connection plate 62 (first installation member in the present disclosure), a flexible packing 63 (sealing part in the present disclosure), a first pressing plate 64, a second pressing plate 65, and an upper plate 66 (cover in the present disclosure). One connection module 60 is assembled by combining these members. The main body 61 is fixed to the rear wall 34. The connection plate 62 is fixed to the gate valve 10. The flexible packing 63 is arranged between the main body 61 and the connection plate 62 in the front-rear direction. The first pressing plate 64 is a member for fixing a front end portion 63*a* (described later) of the flexible packing 63 to the main body 61. The second pressing plate 65 is a member for fixing a rear end portion 63*b* (described later) of the flexible packing 63 to the connection plate 62. The upper plate 66 is fixed to, for example, an upper surface portion 61*g* (described later) of the main body 61.

The main body 61 is a substantially rectangular box-shaped member. It is desirable that the main body 61 is made of, for example, a metal material. Moreover, it is desirable that the main body 61 is made of a material having corrosion resistance. For example, the front, rear, and upper surfaces of the main body 61 are opened. The other surfaces (lower surface, left surface, and right surface) of the main body 61 are closed. For example, a substantially rectangular opening 61*a* (see FIG. 7A) is formed in the front surface of the main body 61. A frame-shaped flange 61*b* (first frame part in the present disclosure) (see FIGS. 7A to 9) is provided on the front surface of the main body 61. In other words, it can be said that the box-shaped portion (hollow protrusion 61*c*) of the main body 61 is provided so as to protrude more rearward than the flange 61*b* and the rear wall 34. The flange

61*b* extends outward in the left-right direction and outward in the up-down direction with respect to the opening 61*a*. The flange 61*b* is arranged more frontward than the rear wall 34. The flange 61*b* is installed on the front surface of the rear wall 34. The flange 61*b* includes a plurality of through holes 61*b*1 (see FIGS. 7A to 9) extending in the front-rear direction. For example, a substantially rectangular opening 61*e* (see FIG. 8) is formed at the rear surface portion 61*d* of the protrusion 61*c* (see FIG. 8) (second frame part in the present disclosure). The rear surface portion 61*d* is arranged, for example, more rearward than the flange 61*b*. The rear surface portion 61*d* is, for example, integrally formed with the flange 61*b* (i.e., connected to the flange 61*b*). The rear surface portion 61*d* is arranged so as to surround a through hole 62*a* (described later) of the connection plate 62 when viewed from the front side. A plurality of through holes 61*f* extending in the front-rear direction is formed in the rear surface portion 61*d*. For example, a bolt 81 is inserted into each of the plurality of through holes 61*f* (see FIG. 9). For example, a substantially rectangular opening 61*h* (see FIG. 8) is formed in the upper surface portion 61*g* of the protrusion 61*c*. The opening 61*h* is an opening which is capable of connecting the external space 9 and the internal space of the main body 61. For example, a plurality of thread holes 61*i* (see FIG. 8) are formed in the upper surface portion 61*g*.

Now, details of the rear wall 34 will be described. The rear wall 34 includes a substantially rectangular opening 34*a* (housing-side opening in the present disclosure) (see FIG. 9) when viewed in the front-rear direction. A plurality of columnar portions 34*b* (see FIG. 9) protruding frontward is formed on the front surface of the rear wall 34. Each columnar portion 34*b* is, for example, a substantially cylindrical portion. A male thread is formed on each columnar portion 34*b*. The plurality of columnar portions 34*b* are arranged at approximately the same positions in the left-right direction and the up-down direction as the through holes 61*b*1 of the flange 61*b*. That is, each of the plurality of columnar portions 34*b* is inserted into the through hole 61*b*1 of the flange 61*b*. A packing 71 is arranged between the flange 61*b* and the rear wall 34 in the front-rear direction. The packing 71 includes a through hole 71*a* which is slightly larger than the opening 61*a* when viewed in the front-rear direction. The packing 71 includes a plurality of through holes 71*b* into which the plurality of columnar portions 34*b* are respectively inserted. A size of each through hole 71*b* is approximately the same as the size of through hole 61*b*1. The flange 61*b* and the packing 71 are fixed to the rear wall 34 by, for example, a plurality of nuts 83 (first fixing part and first operating part in the present disclosure) (see FIG. 9) each having a female thread. The plurality of nuts 83 are arranged more frontward than the rear wall 34, the flange 61*b*, and the packing 71. The plurality of nuts 83 is screwed to the plurality of columnar portions 34*b*, respectively.

The connection plate 62 is a member for installing the connection module 60 on the frame portion 54 regardless of specifications of the frame portion 54 of the gate valve 10. The connection plate 62 is a substantially rectangular plate-shaped member when viewed in the front-rear direction. The connection plate 62 is made of, for example, a metal material. The connection plate 62 is arranged on the front side of the frame portion 54 (see FIG. 9). The connection plate 62 includes a through hole 62*a* (front chamber-side opening in the present disclosure) extending in the front-rear direction. The through hole 62*a* is longer than the through hole 55*a* (see FIG. 6B) of the gate portion 55 in both the left-right direction and the up-down direction. The connection plate 62 includes a plurality of through holes 62*b* (see FIG. 8) extending in the front-rear direction. The plurality of through holes 62*b* are holes into which a plurality of bolts (not shown) are inserted. The size and position of the plurality of through holes 62*b* are designed according to the specifications of the frame portion 54 (i.e., the size and position of the plurality of thread holes 54*c*). For example, a packing 72 having a substantially rectangular shape when viewed in the front-rear direction is disposed between the connection plate 62 and the frame portion 54 in the front-rear direction. The packing 72 includes a through hole 72*a* extending in the front-rear direction. The size of the through hole 72*a* is approximately the same as the size of the opening 54*a* of the frame portion 54 (see FIG. 9). The packing 72 includes a plurality of through holes 72*b*, and the size of each through hole 72*b* is approximately the same as the size of the through hole 62*b*. The connection plate 62 and the packing 72 are screwed (fixed) to the frame portion 54 by using, for example, the plurality of bolts (not shown) mentioned above. Furthermore, a plurality of thread holes 62*c* (see FIG. 9) are formed on the front surface of the connection plate 62. A bolt 82 (second fixing part in the present disclosure), which will be described later, is screwed to each of the plurality of thread holes 62*c* (see FIG. 9). The assembly of the frame portion 54 and the connection plate 62 corresponds to the front chamber-side opening portion in the present disclosure. The frame portion 54 is part of the load lock chamber 7. The connection plate 62 is part of the connection module 60.

The flexible packing 63 is a substantially rectangular member when viewed in the front-rear direction. The flexible packing is made of a rubber material such as EPDM (ethylene propylene rubber). The flexible packing 63 is arranged on the rear side of the main body 61 and on the front side of the connection plate 62. The flexible packing 63 has a bellows structure which allows the flexible packing 63 to expand and contract at least in the front-rear direction. More specifically, the flexible packing 63 has a front end portion 63*a*, a rear end portion 63*b* (enclosure portion in the present disclosure), and an extensible portion 63*c* (flexible portion in the present disclosure).

The front end portion 63*a* is a frame-shaped portion fixed to the rear surface of the main body 61. The front end portion 63*a* has, for example, a substantially rectangular opening 63*d* when viewed in the front-rear direction. A size of the opening 63*d* is approximately the same as the size of the opening 61*e* of the main body 61 (see FIG. 8). The front surface of the front end portion 63*a* contacts the rear surface of the main body 61 over the entire circumference. The front end portion 63*a* includes, for example, a plurality of through holes 63*e* extending in the front-rear direction. Positions of the plurality of through holes 63*e* in the horizontal direction and the vertical direction are substantially the same as the positions of the plurality of through holes 61*f* in the horizontal direction and the vertical direction. For example, a bolt 81 is inserted into each of the plurality of through holes 63*e* (see FIG. 9).

The rear end portion 63*b* is a frame-shaped portion fixed to the front surface of the connection plate 62. The length of the rear end portion 63*b* in the left-right direction is, for example, approximately the same as or less than the length of the opening 63*d* of the front end portion 63*a* in the left-right direction (see FIG. 9). Similarly, the length of the rear end portion 63*b* in the up-down direction is, for example, approximately the same as or less than the length of the opening 63*d* in the up-down direction. This allows an operator to access the rear end portion 63*b* from the front side when installing the connection module 60 on the EFEM

1 and the processing apparatus 6. The rear end portion 63*b* includes, for example, a substantially rectangular opening 63*f* when viewed in the front-rear direction. A size of the opening 63*f* is, for example, approximately the same as the size of the through hole 62*a* of the connection plate 62 (see FIG. 9). The rear end portion 63*b* is arranged so as to surround the through hole 62*a* when viewed in the front-rear direction. The rear surface of the rear end portion 63*b* contacts the front surface of the connection plate 62 over its entire circumference. The rear end portion 63*b* includes, for example, a plurality of through holes 63*g* extending in the front-rear direction. For example, a bolt 82 is inserted into each of the plurality of through holes 63*g*.

The extensible portion 63*c* is a portion having a bellows structure for expanding and contracting the flexible packing 63 in the front-rear direction. The entire extensible portion 63*c* in the left-right direction and the up-down direction is configured to be extensible and contractible in the front-rear direction. Thus, the entire rear end portion 63*b* can be moved in parallel to the connection plate 62 in the front-rear direction without being fixed to the connection plate 62. That is, the position of the entire rear end portion 63*b* can be adjusted in the front-rear direction. Further, the extensible portion 63*c* is configured such that only a portion thereof in the left-right direction and/or the up-down direction can be expanded and contracted in the front-rear direction. Thus, only a portion of the rear end portion 63*b* can be moved in the front-rear direction with respect to the connection plate 62. In other words, it is also possible to adjust an inclination angle of the rear end portion 63*b* with respect to the connection plate 62.

The first pressing plate 64 is a member for fixing the front end portion 63*a* of the flexible packing 63 to the rear surface portion 61*d* of the main body 61. The first pressing plate 64 is a frame-shaped member which has an approximately rectangular shape when viewed in the front-rear direction. When viewed in the front-rear direction, a size of the first pressing plate 64 is approximately the same as the size of the rear surface portion 61*d*. The first pressing plate 64 is disposed more rearward than the rear surface portion 61*d* of the main body 61 and the front end portion 63*a* of the flexible packing 63. The first pressing plate 64 is arranged, for example, more frontward than the rear end portion 63*b* of the flexible packing 63. The first pressing plate 64 includes a through hole 64*a* extending in the front-rear direction. The through hole 64*a* is, for example, slightly larger than the opening 61*e* of the main body 61 (see FIG. 9). The first pressing plate 64 includes, for example, a plurality of through holes 64*b* extending in the front-rear direction. Positions of the plurality of through holes 64*b* in the left-right direction and the up-down direction are substantially the same as the positions of the plurality of through-holes 61*f* in the left-right direction and the up-down direction. For example, a female thread is formed in each through hole 64*b*. A bolt 81 is screwed to each through hole 64*b* (see FIG. 9).

The second pressing plate 65 is a member for fixing the rear end portion 63*b* of the flexible packing 63 to the connection plate 62. The second pressing plate 65 is a frame-shaped member which has an approximately rectangular shape when viewed in the front-rear direction. A size of the second pressing plate 65 is approximately the same as the size of the rear end portion 63*b* of the flexible packing 63 when viewed in the front-rear direction. The second pressing plate 65 is arranged on the rear side of the connection plate 62. The second pressing plate 65 includes a through hole 65*a* extending in the front-rear direction. When viewed in the front-rear direction, a size of the through hole 65*a* is approximately the same as the size of the through hole 62*a* of the connection plate 62, for example. The second pressing plate 65 has, for example, a plurality of through holes 65*b* extending in the front-rear direction. A bolt 82 is inserted into each through hole 65*b* (see FIG. 9).

The upper plate 66 is a plate-shaped member for closing the opening 61*h* (see FIG. 8) of the main body 61. The upper plate 66 has a substantially rectangular shape when viewed in the up-down direction. The upper plate 66 is screwed to the upper surface of the main body 61 by using, for example, a plurality of bolts 84 (see FIG. 8). In other words, the upper plate 66 is detachably installed on the main body 61 (i.e., so that the opening 61*h* can be opened and closed). For example, a substantially rectangular packing 73 (see FIG. 8) is disposed between the upper plate 66 and the upper surface portion 61*g* of the main body 61 in the up-down direction. The packing 73 includes a through hole 73*a* that is approximately the same size as the opening 61*h*. The packing 73 includes a plurality of through holes 73*b* corresponding to the plurality of thread holes 61*i*.

The plurality of bolts 81 are members for fixing the flexible packing 63 to the rear surface portion 61*d* of the main body 61. Each of the plurality of bolts 81 includes a head 81*a* and a shaft portion 81*b*. The plurality of bolts 81 may be, for example, hexagonal bolts whose heads 81*a* can be turned by a spanner (not shown). Alternatively, the plurality of bolts 81 may be hexagon socket bolts whose heads 81*a* can be turned by a hexagonal wrench (not shown). The plurality of bolts 81 may be other types of bolts. The head 81*a* is arranged on the front side of the shaft portion 81*b*. The shaft portion 81*b* extends in the front-rear direction. The shaft portion 81*b* protrudes rearward from the head 81*a*. A male thread is formed on the shaft portion 81*b*. The shaft portion 81*b* is screwed to the through hole 64*b* of the first pressing plate 64.

The plurality of bolts 82 are members for fixing (pressing) the flexible packing 63 to the connection plate 62. Each of the plurality of bolts 82 includes a head 82*a* (second operating part in the present disclosure) and a shaft portion 82*b*. The plurality of bolts 82 may be, for example, hexagonal bolts whose heads 82*a* can be turned by a spanner (not shown). Alternatively, the plurality of bolts 82 may be hexagon socket bolts whose heads 82*a* can be turned by a hexagonal wrench (not shown). The plurality of bolts 82 may be other types of bolts. The head 82*a* is configured such that an operation for fixing the flexible packing 63 to the connection plate 62 can be performed. The head 82*a* is arranged on the front side of the shaft portion 82*b*. The head 82*a* is disposed more frontward than the rear end portion 63*b* of the flexible packing 63. The shaft portion 82*b* extends in the front-rear direction. The shaft portion 82*b* protrudes rearward from the head 82*a*. A male thread is formed on the shaft portion 82*b*. The shaft portion 82*b* is screwed to the thread hole 62*c* of the connection plate 62.

The plurality of nuts 83 are members for fixing (pressing) the main body 61 to the rear wall 34. The plurality of nuts 83 are configured such that an operation for fixing the flange 61*b* to the rear wall 34 can be performed. The plurality of nuts 83 are, for example, hexagonal nuts that can be turned with a spanner (not shown). The plurality of nuts 83 are arranged more frontward than the flange 61*b* of the main body 61. Each nut 83 is screwed to the columnar portion 34*b*.

(Connection Module Installation Method)

Figure 10:
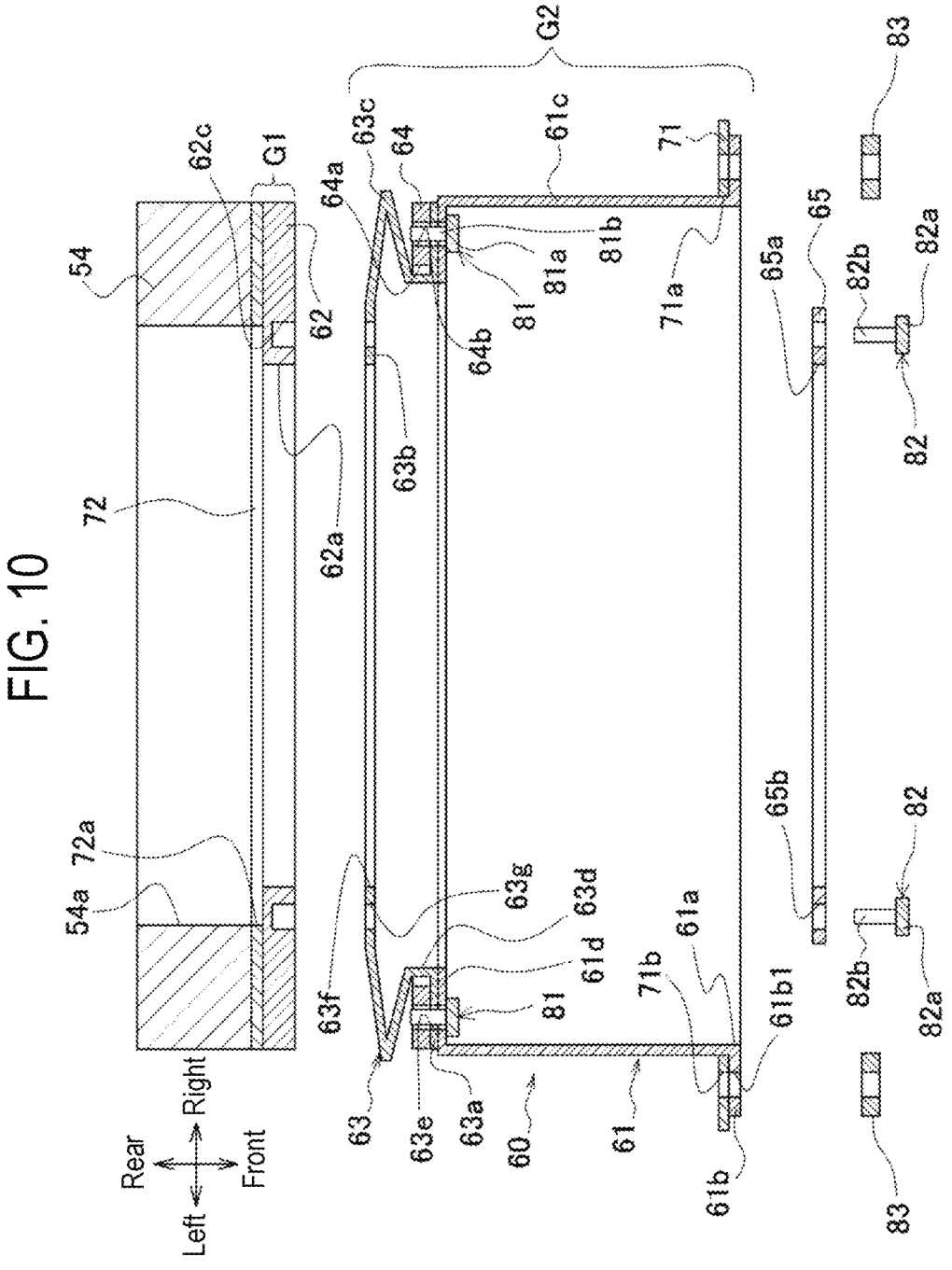
FIG. 10 is an explanatory diagram showing a method of installing a connection module on an EFEM and a load lock chamber.
Figure 11:
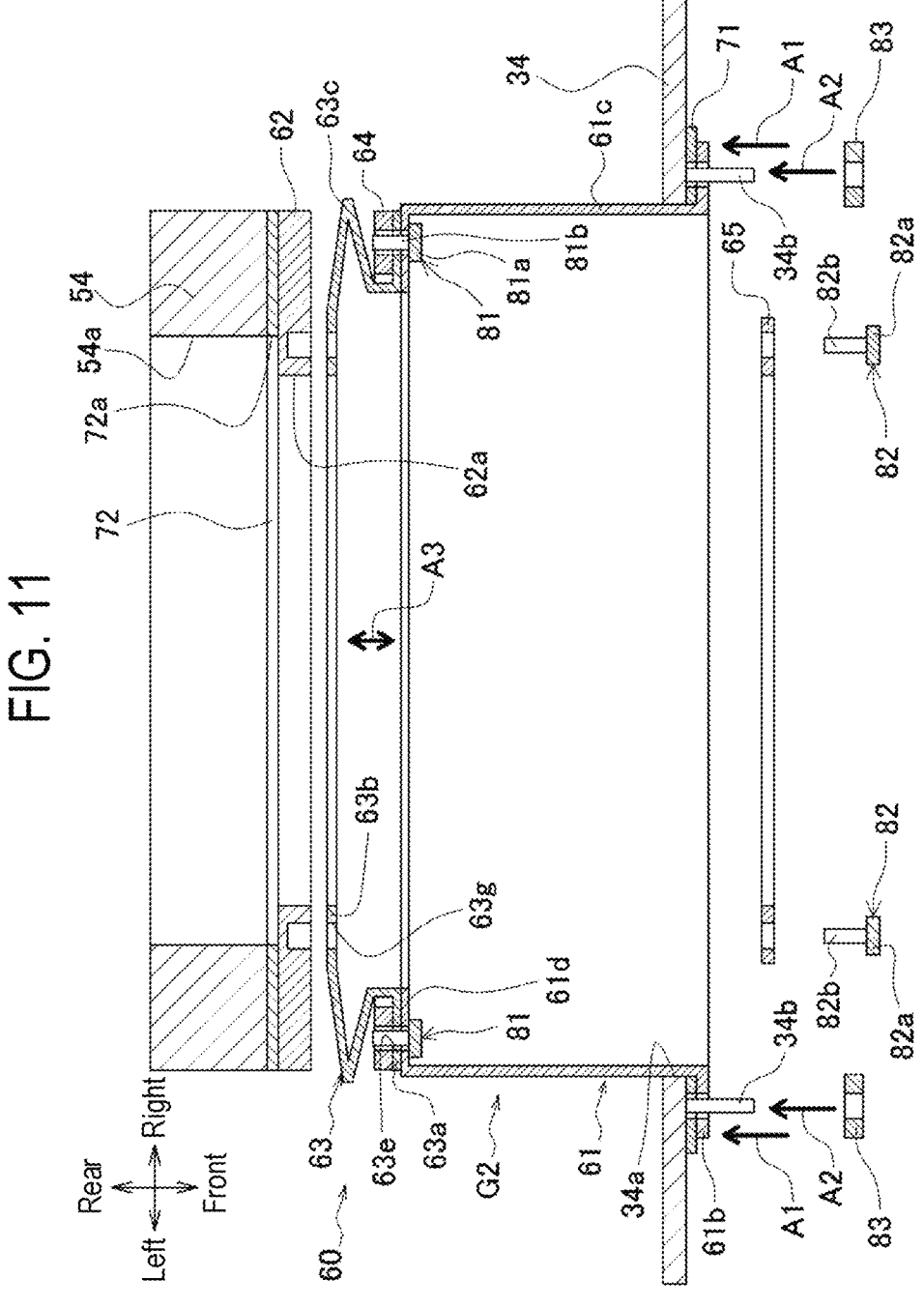
FIG. 11 is an explanatory diagram showing a method of installing a connection module on an EFEM and the load lock chamber.
Figure 12:
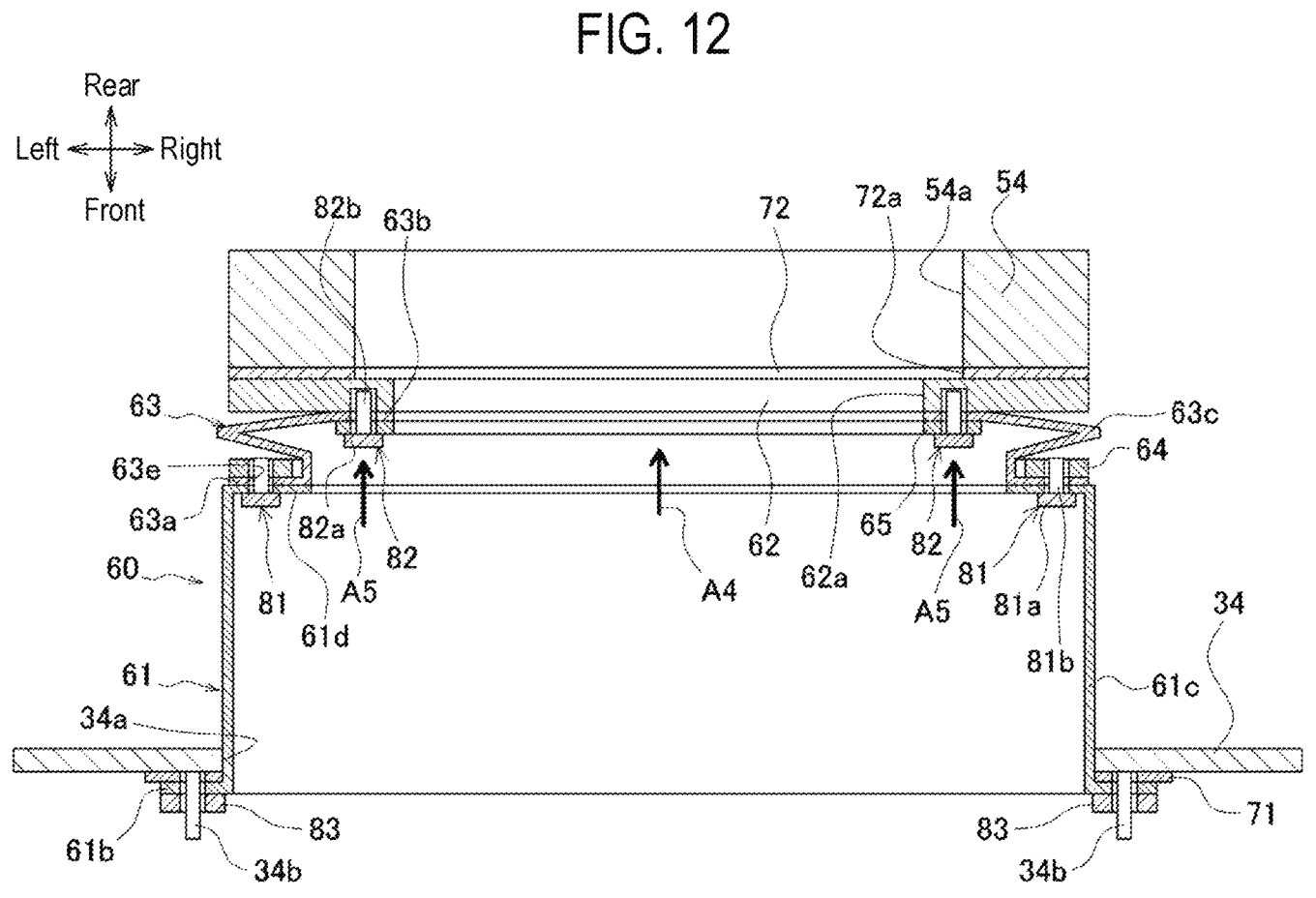

Next, a method of installing the connection module 60 on the EFEM 1 and the processing apparatus 6 will be described with reference to FIGS. 10 to 12. FIGS. 10 to 12 are explanatory diagrams showing the method of installing the connection module 60 on the EFEM 1 and the load lock chamber 7. For the sake of convenience of description, the directions shown in FIGS. 10 to 12 are the same as the directions shown in FIG. 9.

First, the connection module 60 is divided into a plurality of component groups and transported to a factory where the processing apparatus 6 is installed (or has already been installed). The plurality of component groups includes, for example, a first group G1 and a second group G2 (see FIG. 10). The first group G1 includes the connection plate 62 and the packing 72. The members constituting the first group G1 are fixed in advance to the frame portion 54 of the gate valve 10 before the installation operation described below is performed (see FIG. 10). The members constituting the first group G1 may be transported to a factory together with the gate valve 10 while being fixed to the frame portion 54. Alternatively, the members constituting the first group G1 may be transported to a factory and then fixed to the frame portion 54 of the gate valve 10 included in the processing apparatus 6, which is already installed at the factory.

The second group G2 includes the main body 61, the flexible packing 63, the first pressing plate 64, the upper plate 66, the packing 71, the packing 73, and the plurality of bolts 81. The members constituting the second group G2 are assembled in advance into one component before the installation operation is performed (see FIG. 10). In addition, the second pressing plate 65, the plurality of bolts 82, and the plurality of nuts 83 are transported to a factory, for example, while being separated from other members. Furthermore, the housing 2 which constitutes the EFEM 1 is also transported to the factory.

Thereafter, the processing apparatus 6 and the housing 2 are installed, for example, in a predetermined clean chamber in a factory. After the processing apparatus 6 is installed, the housing 2 is aligned with the processing apparatus 6. More specifically, the rear wall 34 of the housing 2 is aligned with the gate valve 10 (and the connection plate 62) in the left-right direction and the up-down direction. In the front-rear direction, a certain positional deviation may occur between the rear wall 34 and the gate valve 10 (more precisely, the connection plate 62) due to both the design error of the EFEM 1 and the design error of the processing apparatus 6.

An operator enters the internal space 40 (more specifically, the transfer chamber 41) of the housing 2, for example, and performs the following installation operation at an operation position in front of the rear wall 34. First, the operator installs the members constituting the second group G2 on the rear wall 34 of the housing 2. Specifically, as shown in FIG. 11, the members constituting the second group G2 are moved from the front side of the rear wall 34 to the rear side thereof. Thus, the operator inserts the plurality of columnar portions 34*b* into the plurality of through holes 61*b*1 formed in the flange 61*b* and the plurality of through holes 71*b* formed in the packing 71 (see arrow A1 in FIG. 11). Thereafter, the operator rotates (operates) the plurality of nuts 83 by using, for example, a spanner (not shown), and screws the nuts to the plurality of columnar portions 34*b* from the front side. Thus, the operator fixes the members constituting the second group G2 to the rear wall 34 (first fixing operation) (see arrow A2 in FIG. 11). In other words, the operator presses the members constituting the second group G2 against the rear wall 34 (first pressing operation).

Next, the operator aligns the flexible packing 63 in the front-rear direction. More specifically, the operator moves the rear end portion 63b of the flexible packing 63 in the front-rear direction (see arrow A3 in FIG. 11) and/or adjusts an inclination angle of the rear end portion 63b with respect to the connection plate 62. The rear end portion 63b is configured to be movable by the extensible portion 63c. Since the extensible portion 63c has the bellows structure as described above, it is possible to maintain a deformed state thereof to some extent. In other words, even when the rear end portion 63b is displaced by an external force and then the external force is no longer applied, it is possible to maintain the arrangement position of the rear end portion 63b after displacement to some extent. Therefore, the operator can let go of the rear end portion 63b after roughly adjusting the position of the rear end portion 63b.

Next, as shown in FIG. 12, the operator moves the second pressing plate 65 from the front side to the rear side and presses it against the front surface of the rear end portion 63b of the flexible packing 63 (see arrow A4 in FIG. 12). Finally, the operator rotates (operates) the plurality of bolts 82 using, for example, a spanner (not shown) and screws the second pressing plate 65 and the rear end portion 63b to the connection plate 62 (second fixing operation) (see arrow A5 in FIG. 12). In other words, the operator presses the second pressing plate 65 and the rear end portion 63b against the connection plate 62 (second pressing operation). In this way, the operation of installing the connection module 60 on the EFEM 1 and the load lock chamber 7 is completed.

In the state where the connection module 60 is installed on the EFEM 1 and the load lock chamber 7, the upper plate 66 can be attached to and detached from the main body 61. Thus, the opening 61h can be opened and closed. When the opening 61h is opened, the inside of the main body 61 can be visually recognized from the external space 9. Further, when the opening 61h is opened, the inside of the main body 61 can be accessed from the external space 9. When the opening 61h is closed, the EFEM 1 can be operated.

As described above, the flange 61b can be installed on (pressed by) the rear wall 34 from the front side. Further, the rear end portion 63b of the flexible packing 63 can be installed on (pressed by) the connection plate 62 from the front side. Therefore, after both the EFEM 1 and the processing apparatus 6 are installed, the connection module 60 can be installed on (pressed by) the rear wall 34 and the connection plate 62 from the front side (i.e., inside the housing 2). Furthermore, after the flange 61b is installed on (pressed by) the rear wall 34, the rear end portion 63b is moved in the front-rear direction to adjust the position, whereby it is possible to easily compensate for the positional deviation between the rear end portion 63b and the connection plate 62 in the front-rear direction. Therefore, even if the connection module 60 cannot be installed outside the EFEM 1, the connection module 60 can be easily installed on (pressed by) the EFEM 1 and the load lock chamber 7.

Further, the connection plate 62 is part of the connection module 60, and the frame portion 54 is part of the load lock chamber 7. Thus, by preparing the connection plate 62 according to the specifications of the frame portion 54 belonging to the load lock chamber 7, the connection module 60 can be installed on any load lock chamber 7.

Moreover, since the extensible portion 63c has a bellows structure, once the extensible portion 63c is deformed, the shape after deformation is maintained to some extent even if no force is applied again. Therefore, the installation operation can be easily performed.

Moreover, by removing the upper plate 66 from the main body 61 and opening the opening 61h, a state in which the wafer W is being transferred can be visually confirmed from the outside of the housing 2. Furthermore, by removing the upper plate 66 from the main body 61 and opening the opening 61h while the operation of the EFEM 1 is stopped, it is possible to perform the inspection and/or maintenance of the connection module 60 and its surroundings.

Further, the plurality of nuts 83 are arranged on the front side of the rear wall 34, the flange 61b and the packing 71. Moreover, the heads 82a of the plurality of bolts 82 are arranged in front of the rear end portion 63b of the flexible packing 63. Therefore, it is possible to further improve airtightness of a space connecting the transfer chamber and the front chamber while maintaining an environment in which the installation operation can be performed with ease.

Next, modifications of the above-described embodiment will be described. Components having the same configuration as those in the above-described embodiment will be designated by like reference numerals and the description thereof will be omitted as appropriate.

Figure 13:
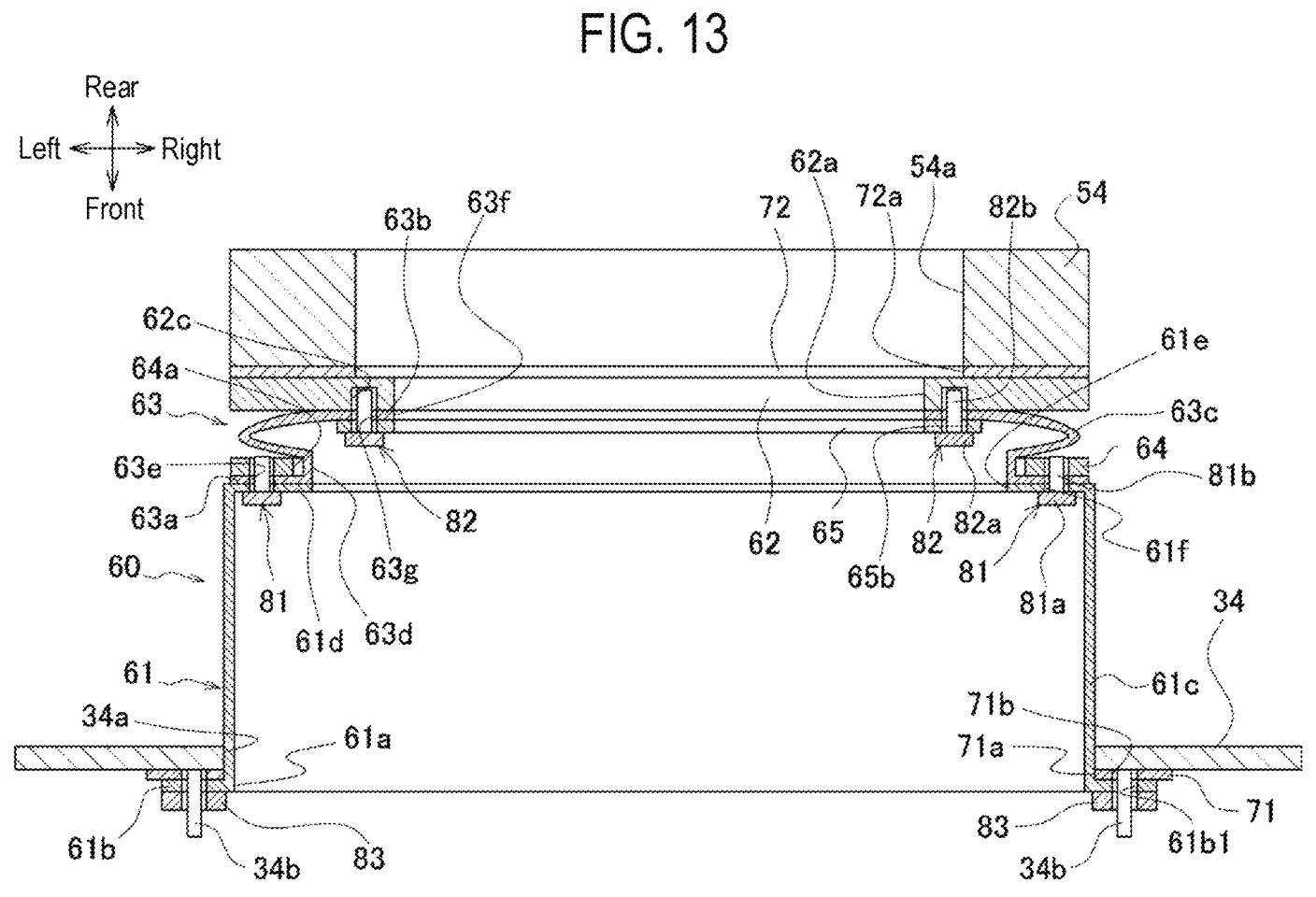

(1) In the above-described embodiment, the extensible portion 63c of the flexible packing 63 has a bellows structure. However, the present disclosure is not limited thereto. For example, the extensible portion 63c may include a cylindrical (e.g., rubber-made) elastic body merely extending in the front-rear direction. Since the front end portion 63a is fixed to the main body 61 and the rear end portion 63b is fixed to the connection plate 62, the flexible packing 63 may be installed on the EFEM 1 and the processing apparatus 6 with the extensible portion 63c slightly loosened (see, e.g., FIG. 13). Alternatively, the flexible packing 63 may be installed on the EFEM 1 and the processing apparatus 6 with the extensible portion 63c slightly expanded.

(2) In the above-described embodiment, the rear end portion 63b of the flexible packing 63 can be moved in parallel to the connection plate 62 in the front-rear direction, and the inclination angle thereof with respect to the connection plate 62 can be adjusted. However, the present disclosure is not limited thereto. For example, the rear end portion 63b may be capable of making only parallel movement in the front-rear direction.

(3) In the above-described embodiment, the opening 61h is opened and closed by attaching and detaching the upper plate 66 to and from the upper surface portion 61g. However, the present disclosure is not limited thereto. The upper plate 66 may be configured to be slidable, for example, in the left-right direction with respect to the upper surface portion 61g. Alternatively, the upper plate 66 may be detachably installed on the main body 61 via a hinge (not shown) so as to be openable and closable. Further, in the above-described embodiment, the opening 61h is formed in the upper surface portion 61g of the main body 61. However, the present disclosure is not limited thereto. Instead of the opening 61h, for example, an opening (not shown) may be formed in the right portion or left portion of the main body 61, and a cover (not shown) which can open and close the opening may be provided. Alternatively, the opening corresponding to the opening 61h may not be formed.

(4) In the above-described embodiment, the operator performs the second fixing operation (second pressing operation) after the first fixing operation (first pressing operation). However, the present disclosure is not limited thereto. For example, the operator may perform the first fixing operation (first pressing operation) after the second fixing operation (second pressing operation). In this case, after fixing the flexible packing 63 to the connection plate 62, the operator may move the flange 61*b* to align the flange 61*b* and the rear wall 34 in the front-rear direction. Alternatively, the operator may perform the first fixing operation and the second fixing operation substantially at the same time.

(5) In the above-described embodiment, the assembly of the frame portion 54 and the connection plate 62 corresponds to the front chamber-side opening portion in the present disclosure. Further, the frame portion 54 is part of the load lock chamber 7, and the connection plate 62 is part of the connection module 60. That is, the rear end portion 63*b* of the flexible packing 63 of the connection module 60 is installed on the frame portion 54 via the connection plate 62. However, the present disclosure is not limited thereto. For example, if the rear end portion 63*b* of the flexible packing 63 can be directly fixed to the frame portion 54 without using the connection plate 62, the connection module 60 may not include the connection plate 62. That is, for example, if the specifications (i.e., the structure) of the frame portion 54 are suitable for the rear end portion 63*b* to be directly installed, the connection plate 62 is not necessary. In this case, the frame portion 54 corresponds to the front chamber-side opening portion in the present disclosure, and the opening 54*a* corresponds to the front chamber-side opening in the present disclosure. In addition, in the above-described embodiment, the opening 54*a* is larger than the rear end portion 63*b*, and it is difficult to directly screw the rear end portion 63*b* to the frame portion 54. For this reason, the flexible packing 63 is fixed to the frame portion 54 via the connection plate 62.

(6) In the above-described embodiment, the main body 61 includes the protrusion 61*c* that protrudes more rearward than the flange 61*b* and the rear wall 34. However, the present disclosure is not limited thereto. The main body 61 may have another shape depending on the shape and arrangement position of the frame portion 54. For example, instead of the main body 61, a flat frame-shaped member may be provided as the main body (not shown). Alternatively, if the frame portion 54 of the gate valve 10 is configured to protrude more frontward than the rear wall 34 (i.e., into the housing 2), a protrusion (not shown) protruding more frontward than the rear wall 34 and the flange 61*b* may also be provided instead of the protrusion 61*c*. In such a protrusion, a frame-shaped portion corresponding to the rear surface portion 61*d* may be provided at the front end portion.

(7) In the above-described embodiment, the flange 61*b* is installed on the rear wall 34 by the nuts 83. However, the present disclosure is not limited thereto. For example, the flange 61*b* may be installed on the rear wall 34 by bolts (not shown) instead of the nuts 83. In this case, for example, a thread hole (not shown) may be provided in the rear wall 34 instead of the columnar portion 34*b*. Further, in the above-described embodiment, the rear end portion 63*b* of the flexible packing 63 is installed on the connection plate 62 by the bolts 82. However, the present disclosure is not limited thereto. For example, the rear end portion 63*b* of the flexible packing 63 may be installed on the connection plate 62 by nuts (not shown) instead of the bolts 82. In this case, for example, instead of the thread hole 62*c*, the connection plate 62 may have a cylindrical portion that protrudes toward the front side and has a male thread.

(8) The member for installing (pressing) the flange 61*b* on (against) the rear wall 34 and the member for installing (pressing) the rear end portion 63*b* of the flexible packing 63 on (against) the connection plate 62 are not limited to those described above. For example, a clamp (not shown) may be used. In this case, the plurality of members fixed to each other by the clamp are required to have a portion that can be pinched by the clamp.

Alternatively, if the EFEM 1 is not configured to circulate an inert gas, the flange 61*b* does not necessarily need to be fixed to the rear wall 34. Further, in this case, the rear end portion 63*b* of the flexible packing 63 does not necessarily have to be fixed to the connection plate 62. For example, if the transfer chamber 41 of the EFEM 1 is configured to be filled with the ambient air and does not require higher airtightness than the EFEM 1 described above, a member (not shown) for simply pressing the flange 61*b* against the rear wall 34 may also be provided. Further, in this case, a member (not shown) for simply pressing the rear end portion 63*b* of the flexible packing 63 against the connection plate 62 may be provided.

(9) In the above-described embodiment, the load lock chamber 7 maintained at an atmospheric pressure close to vacuum corresponds to the front chamber in the present disclosure. However, the present disclosure is not limited thereto. The connection module 60 may be connected to, for example, a chamber (not shown) maintained at approximately the same atmospheric pressure as the transfer chamber 41. In this case, the chamber corresponds to the front chamber in the present disclosure.

(10) In the above-described embodiment, the wafer W is transferred within the transfer chamber 41. However, the present disclosure is not limited thereto. Objects (processing target objects) other than the wafer W may be transferred within the transfer chamber 41.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An EFEM comprising:

a housing including a transfer chamber in which a processing target object is transferred; and a connection module provided between the transfer chamber and a front chamber, which is provided in a processing apparatus for performing a predetermined process on the processing target object, wherein the housing includes a rear member having a housing-side opening through which the processing target object is capable of passing, wherein the connection module includes:

a first frame part arranged around the housing-side opening and pressed by a transfer chamber-side surface of the rear member when the housing-side opening is viewed from the transfer chamber side;

a second frame part provided in the front chamber and arranged around a front chamber-side opening through which the processing target object is capable of passing when the housing-side opening is viewed from the transfer chamber side, and connected to the first frame part; and a sealing part arranged closer to the front chamber than the second frame part, fixed to the second frame part, and configured to seal the second frame part and the front chamber by being pressed by a front chamber-side opening portion which forms the front chamber-side opening, and wherein the sealing part includes:

a flexible portion capable of expanding and contracting at least in a predetermined direction in which the housing and the processing apparatus are arranged side by side; and an enclosure portion connected to the flexible portion and configured to enclose the front chamber-side opening.

2. The EFEM of claim 1, wherein the front chamber-side opening portion includes:

a first installation member on which the enclosure portion is installed; and a second installation member arranged closer to the front chamber than the first installation member so that the first installation member is fixed to the second installation member, and wherein the first installation member is part of the connection module and the second installation member is part of the front chamber.

3. The EFEM of claim 2, wherein the front chamber is a load lock chamber.

4. The EFEM of claim 2, wherein the flexible portion has a bellows structure for expanding and contracting the sealing part in the predetermined direction.

5. The EFEM of claim 2, wherein the second frame part is arranged closer to the front chamber than the first frame part, wherein the connection module includes a hollow protrusion, which is arranged between the first frame part and the second frame part and protrudes toward the front chamber side beyond the rear member, and wherein the protrusion includes an opening capable of connecting a space outside the housing and a space inside the protrusion, and a cover capable of opening and closing the opening.

6. The EFEM of claim 2, wherein the connection module includes:

a first fixing part configured to fix the first frame part to the rear member; and a second fixing part configured to fix the sealing part to the front chamber-side opening portion, wherein the first fixing part includes a first operating part arranged closer to the transfer chamber than the first frame part and configured to allow an operation of fixing the first fixing part to the rear member, and wherein the second fixing part includes a second operating part arranged closer to the transfer chamber than the enclosure portion and configured to allow an operation of fixing the sealing part to the front chamber-side opening portion.

7. The EFEM of claim 1, wherein the flexible portion has a bellows structure for expanding and contracting the sealing part in a predetermined direction.

8. The EFEM of claim 7, wherein the front chamber is a load lock chamber.

9. The EFEM of claim 1, wherein the front chamber is a load lock chamber.

10. The EFEM of claim 1, wherein the second frame part is arranged closer to the front chamber than the first frame part, wherein the connection module includes a hollow protrusion, which is arranged between the first frame part and the second frame part and protrudes toward the front chamber side beyond the rear member, and wherein the protrusion includes an opening capable of connecting a space outside the housing and a space inside the protrusion, and a cover capable of opening and closing the opening.

11. The EFEM of claim 1, wherein the connection module includes:

a first fixing part configured to fix the first frame part to the rear member; and a second fixing part configured to fix the sealing part to the front chamber-side opening portion, wherein the first fixing part includes a first operating part arranged closer to the transfer chamber than the first frame part and configured to allow an operation of fixing the first fixing part to the rear member, and wherein the second fixing part includes a second operating part arranged closer to the transfer chamber than the enclosure portion and configured to allow an operation of fixing the sealing part to the front chamber-side opening portion.

* * * * *